United States Patent
Swift

(10) Patent No.: US 9,293,207 B1
(45) Date of Patent: Mar. 22, 2016

(54) EMBEDDED DATA AND CODE NON-VOLATILE MEMORY CELL CONFIGURATIONS

(71) Applicant: FREESCALE SEMICONDUCTOR, INC., Austin, TX (US)

(72) Inventor: Craig T. Swift, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/612,907

(22) Filed: Feb. 3, 2015

(51) Int. Cl.
*G11C 16/04* (2006.01)
*G11C 16/14* (2006.01)

(52) U.S. Cl.
CPC ........................................ *G11C 16/14* (2013.01)

(58) Field of Classification Search
USPC ................... 365/185.11, 230.03, 189.18, 63
See application file for complete search history.

(56) References Cited

U.S. PATENT DOCUMENTS

| 7,158,411 | B2 | 1/2007 | Yeh et al. |
| 7,529,128 | B2 | 5/2009 | Yeh et al. |
| 7,843,730 | B2 | 11/2010 | Syzdek |
| 2011/0255325 | A1* | 10/2011 | Nagatsuka ........... G11C 11/405 365/72 |

OTHER PUBLICATIONS

Sadd et al, "A Physical Nano-crystal Erase Model", CMOS Platform Device Development, 2004 IEEE, 2 pages, Freescale Semiconductor, Austin, TX.
Iannaccone et al, "Three-dimensional simulation of nanocrystal Flash memories", Applied Physics Letters, Apr. 2, 2001, pp. 2046-2048, vol. 78, No. 14, AIP Publishing.

* cited by examiner

*Primary Examiner* — Vu Le

(57) ABSTRACT

An integrated circuit including data and code non-volatile memory configuration is provided. The integrated circuit comprises a first non-volatile memory array for storing code and a second non-volatile memory array for storing data. The first non-volatile memory array comprises a plurality of first non-volatile memory cells, the first non-volatile memory cells each having a first channel width. The second non-volatile memory array comprises a plurality of second non-volatile memory cells, the second non-volatile memory cells each having a second channel width. The second channel width of the second non-volatile memory cells is larger than the first channel width of the first non-volatile memory cells. This allows the data non-volatile memory cells to have a higher transconductance than the code non-volatile memory cells.

20 Claims, 2 Drawing Sheets

EMBEDDED DATA AND CODE NON-VOLATILE MEMORY CELL CONFIGURATIONS

BACKGROUND

1. Field

This disclosure relates generally to integrated circuit memories, and more specifically, to non-volatile memory (NVM) cell configurations for use with data and code.

2. Related Art

A data processing system implemented on an integrated circuit may use one or more non-volatile memories for various purposes. For example, one non-volatile memory may be used to store code that is executed by a processor, and another non-volatile memory may store data. Typically, the contents of the code NVM do not change very often and require only a relatively small number of program/erase cycles over the life of the integrated circuit. On the other hand, the data stored by the data NVM may change often depending on the application, and require many program/erase cycles over the life of the integrated circuit.

There are various types of non-volatile memories. One NVM type uses discrete elements like nanocrystals for charge storage. Other memory types may use nitride or a polysilicon floating gate for charge storage. Generally, any of the various types of NVM cells can be subjected to only a limited number program/erase cycles because each program/erase cycle degrades one or more aspects of the memory cells. For example, in a nanocrystal memory cell having high temperature oxide to isolate the nanocrystals from the control gate, charge trapping may occur in the oxide from repeated program/erase cycles that will cause the erased threshold voltage to rise. Also, the higher erased threshold voltage may be caused by erase saturation due to the nanocrystals on the edge of the control gate not being erased completely. The cells that are not erased completely will prevent a channel from fully forming along the edge of the control gate, resulting in a lower channel transconductance and higher threshold voltage. The higher erased threshold voltage will result in a reduced read margin. Reducing the read margin adversely affects the ability to read data stored in the cell. In an integrated circuit having a data NVM and a code NVM this problem will affect the data NVM much sooner because the data is programmed and erased more frequently, thus leading to premature failure of the integrated circuit.

Therefore, a need exists for an integrated circuit having a code NVM and a data NVM that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
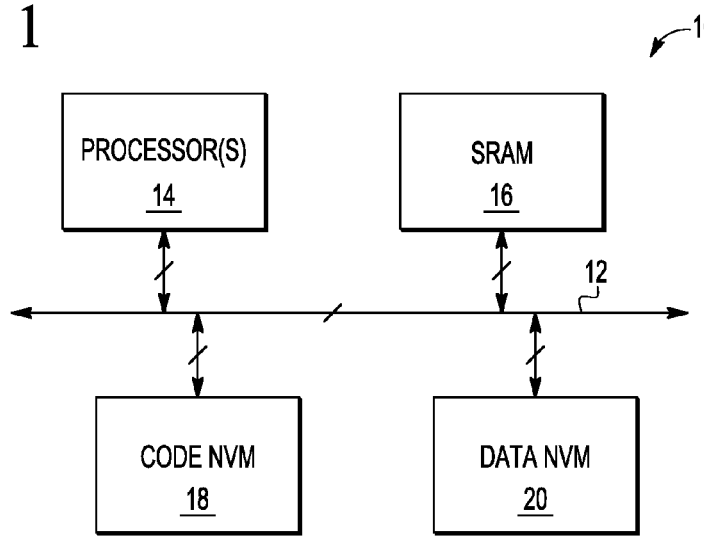
FIG. 1 illustrates, in block diagram form, an integrated circuit in accordance with an embodiment.

Generally, there is provided, an integrated circuit having one or more processors, a code non-volatile memory (NVM) for storing code to be executed by the one or more processors, and a data memory for storing data used by the one or more processors. Both the code NVM and the data NVM use the same split-gate non-volatile memory cell configuration, except that the data memory split-gate memory cells each has a higher channel transconductance than the code memory cells. The higher transconductance mitigates the problem of increased threshold voltage due to repeated program/erase cycles. In one embodiment, the higher channel transconductance is produced by increasing the channel width in the data memory to be greater than the channel width the code memory. In one embodiment, the charge storage layer of the cells includes nanocrystals.

In one embodiment, there is provided, an integrated circuit comprising: a first non-volatile memory array comprising a plurality of first non-volatile memory cells; and a second non-volatile memory array comprising a plurality of second non-volatile memory cells, each of the plurality of second non-volatile memory cells having substantially the same features as the plurality of first non-volatile memory cells, wherein dimensions of the features of the first and second non-volatile memory cells are substantially the same except that a channel width of each second non-volatile memory cell in the second non-volatile memory array is larger than a channel width of each first non-volatile memory cell in the first non-volatile memory array. A first non-volatile memory cell of the plurality of first non-volatile memory cells and a second non-volatile memory cell of the plurality of second non-volatile memory cells may each be characterized as a split-gate non-volatile memory cell having a control gate, a select gate, and a charge storage layer. The channel width of a second non-volatile memory cell may be at least 25% larger than the channel width of a first non-volatile memory cell. The first non-volatile memory array may be used to store processor instructions and the second non-volatile memory array may be used to store data. The charge storage layer may include one or more nanocrystals for storing charge. The one or more nanocrystals may comprise a semiconductor or metal material. The integrated circuit may further comprise a processor coupled to the first non-volatile memory array and second non-volatile memory array. The processor may be capable of providing control information to the first non-volatile memory array and second non-volatile memory array. The channel width of a second non-volatile memory cell may produce a higher transconductance than the channel width of a first non-volatile memory cell. A second non-volatile memory cell may be characterized as being capable of enduring a higher number of program/erase cycles than a first non-volatile memory cell.

In another embodiment, there is provided, a non-volatile memory comprising: a code memory array comprising a plurality of first non-volatile memory cells, the first non-volatile memory cells each having a control gate, a select gate, a charge storage layer, and a first channel width; and a data memory array comprising a plurality of second non-volatile memory cells the second non-volatile memory cells each having a control gate, a select gate, a charge storage layer, and a second channel width, wherein the geometric dimensions of the first non-volatile memory cell and the second non-volatile memory cell are substantially the same except for the second channel width of the second non-volatile memory cells in the data memory array having a larger width than the first channel width of the first non-volatile memory cells in the code memory array. The control gate, the select gate, and the charge storage layer of first non-volatile memory cell and the second non-volatile memory cell are each configured as a split-gate non-volatile memory cell. The charge storage layer of the first non-volatile memory cell and the second non-volatile memory cell may include one or more nanocrystals for storing charge, the one or more nanocrystals may comprise a semiconductor or metal material. The first channel width may be proportional to a first channel transconductance of the first non-volatile memory cells in the code memory array and the second channel width may be proportional to a second channel transconductance of the second non-volatile memory cells in the data memory array. The second channel transconductance of the second non-volatile memory cells may be larger than the first channel transconductance of the first non-volatile memory cells. The second channel transconductance of the second non-volatile memory cells in the data memory array may be at least 25% larger than the first channel transconductance of the first non-volatile memory cells in the code memory array.

In yet another embodiment, there is provided, an integrated circuit comprising: a processor; a code memory array for storing processor instructions, the code memory array comprising a plurality of first non-volatile memory cells, each of the first non-volatile memory cells having a first channel transconductance; and a data memory array for storing data used by the integrated circuit, the data memory array comprising a plurality of second non-volatile memory cells, each of the second non-volatile memory cells having a second channel transconductance, the second channel transconductance of being larger than the first channel transconductance, wherein the processor is coupled to the code memory array and the data memory array via a bus. The processor may be capable of providing program or erase control information to the code memory array and to the data memory array. The processor may be capable of executing instructions stored in the code memory array. The code memory array and the data memory array can share program and erase voltage supply sources. The code memory array and the data memory array can be accessed independently via the bus. The first non-volatile memory cell and the second non-volatile memory cell may each be configured as a split-gate non-volatile memory cell further comprising a nanocrystal charge storage layer.

FIG. 1 illustrates, in block diagram form, integrated circuit 10 in accordance with an embodiment. Integrated circuit 10 includes a bus 12, and one or more processors 14. Memory such as static random access memory (SRAM) 16, code NVM 18, and data NVM 20 are embedded on integrated circuit 10 with processors 14 and may be accessible externally. Bus 12 comprises a plurality of bi-directional conductors. Processor(s) 14 is bi-directionally coupled to bus 12 and may include one or more data processors. The processors may be the same or different and may be microprocessors, microcontrollers, digital signal processors, or any combination thereof. Also, processors 14 may control the operation of memories 16, 18, and 20, although in other embodiments, the memory controllers may be implemented separately from processor(s) 14. Code NVM 18 and data NVM 20 can be accessed independently via bus 12. In other embodiments, code NVM 18 and data NVM 20 may be coupled directly to processor(s) 14, bypassing bus 12. SRAM 16 is bi-directionally coupled to bus 12 and is an example of a memory type that is commonly included on a data processing integrated circuit. In various other embodiments, SRAM 16 may include other types of memory or non-memory circuits. Code NVM 18 is non-volatile memory used for storing code, instructions, software that is executed by the one or more processors 14. Data NVM 20 is used to store data or other information that changes more frequently that the information stored in code NVM 18. Code NVM 18 and data NVM 20 are flash type non-volatile memories having a plurality of cells with floating charge storage layers and control gates for controlling the movement of charge to and from the charge storage layer. The cell configuration of the cells of code NVM 18 and data NVM 20 are substantially the same. That is to say, the cells are the same type of cell, made from the same or similar manufacturing process, and have substantially the same features. The features of both NVMs have substantially the same dimensions, geometrically, except that the memory cells of data NVM 20 have a larger control gate width and select gate width than the control gate width and select gate width of the memory cells of code NVM 18. The larger control gate width results in a larger channel transconductance during a read operation for data NVM 20 than for code NVM 18. This solves the problem caused by having partially erased cells at the edges of the control gate, thereby allowing for higher read margins of data NVM 20 for a higher number of program/erase cycles than code NVM 18. Because code NVM 18 and the data NVM 20 are the same cell types, they can share program and erase voltage supply sources (not shown).

The charge storage layers of the NVM arrays 18 and 20 may comprise polysilicon, nitride, or nanocrystals for storing charge. The plurality of nanocrystals 40 are conventional nanocrystals comprising one or more of various semiconductors, conductors, and silicides. In the illustrated embodiment, the plurality of nanocrystals 40 comprises silicon.

Figure 2:
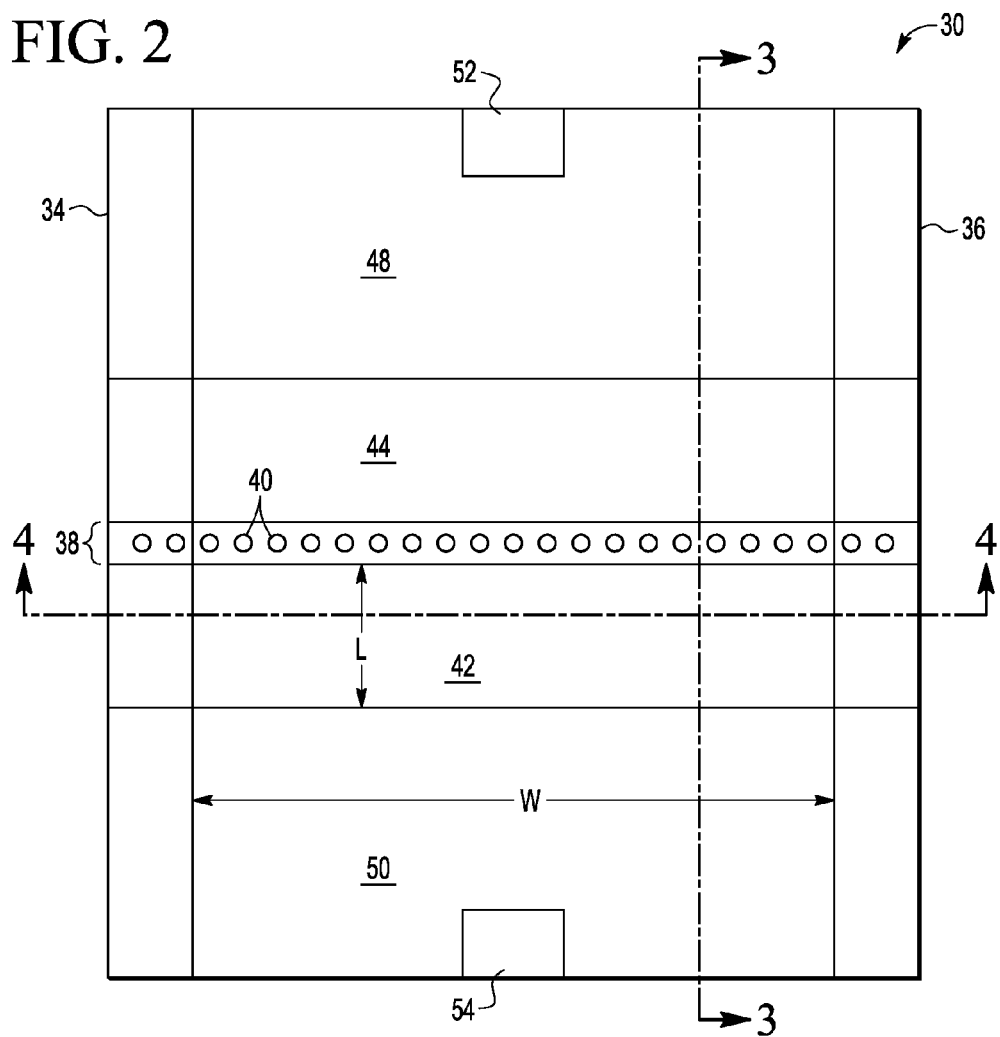
FIG. 2 illustrates a top down view of a non-volatile memory cell that can be used in the integrated circuit of FIG. 1.

FIG. 2 illustrates a top down view of NVM cell 30. Non-volatile memory cell 30 is representative of the cells used in both code NVM 18 and data NVM 20. Non-volatile memory cell 30 is a split-gate NVM cell and includes trench isolation regions 34 and 36, a control gate 42, select gate 44, charge storage layer 38, drain region 48, source region 50, drain contact 52, and source contact 54. In the illustrated embodiment, charge storage layer 38 includes a plurality of nanocrystals 40 sandwiched between two oxide layers. To form charge storage layer 38, an oxide layer is first grown on a silicon substrate. The nanocrystals are deposited on the grown oxide layer, and then a high temperature oxide is deposited over the nanocrystals. The nanocrystals may comprise a semiconductor material or a metal. In other embodiments, the charge storage layer may be different.

Non-volatile memories 18 and 20 each comprises an array of split-gate memory cells organized in rows and columns. Conventional access circuitry is used for reading, programming, and erasing the memory cells of NVM cell 30. Trench isolation regions 34 and 36 define a column of memory cells; the distance "W" between trenches 34 and 36 defines an active area for forming a channel under control gate 42. The crossing area of the control gate over the active area determines the control gate width of the memory cells including memory cell 30. The control gate length "L" is determined by the width of the polysilicon conductor over the active area. Note that the control gate material may continue across the array of memory cells (not shown). In one embodiment, the control gate material may be polysilicon.

The gate width W for the memory cells used in the data NVM 20 is larger than the gate width W for the memory cells used in the code NVM 18. In one embodiment, the control gate width W is at least 25 percent larger to overcome the edge effects the edge nanocrystals have on channel width during a read operation. Because code NVM 18 is not programmed and erased as often as the data NVM 20, the code NVM 18 cell can be smaller, thus saving surface area on integrated circuit 10.

Figure 3:
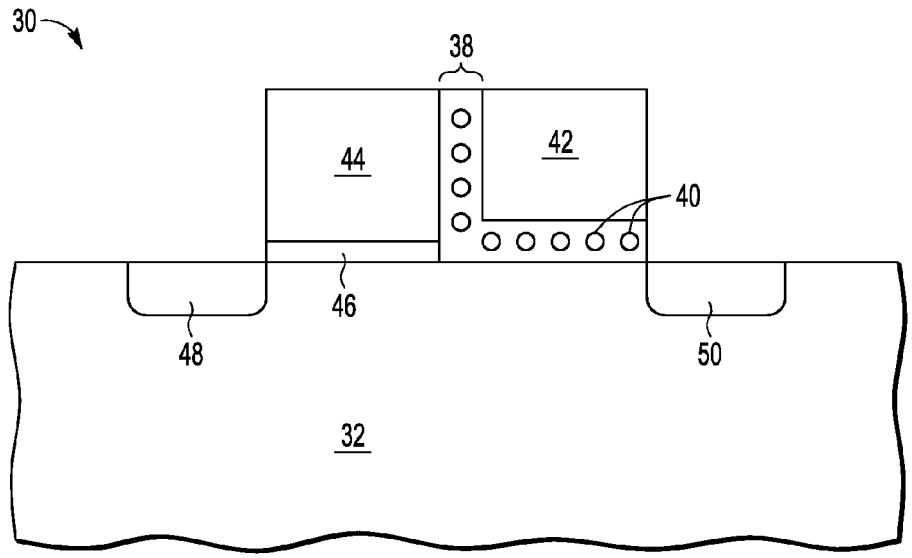
FIG. 3 illustrates a cross-sectional view of the memory cell of FIG. 2 along the line 3-3.

FIG. 3 illustrates a cross-sectional view of NVM cell 30 of FIG. 2 along the line 3-3. Non-volatile memory cell 30 is characterized as being a split-gate memory cell. FIG. 3 depicts non-volatile memory cell 30 along the direction of the bit lines (not shown). A drain region 48 and source region 50 are diffused impurity areas in silicon substrate 32. Select gate 44 is formed over a gate dielectric 46. Control gate 42 is separated from substrate 32 and select gate 44 by charge storage layer 38. Using the same type cell having the same manufacturing process for both code NVM 18 and data NVM 20 simplifies the manufacturing and thus lowers cost.

When non-volatile memory cell 30 is read and programmed a conductive channel is formed under control gate 44 and select gate 42 between drain region 48 and source regions 50. Hot carrier injection is the mechanism used for programming. Fowler-Nordheim tunneling is the mechanism used for erasing. The nanocrystals on the edge of the control gate and the active area, at the edge of trench isolation 34 and 36, may not be erased fully because a weaker electric field is developed at the edge during erasure. The nanocrystals that are not erased fully will have a higher threshold voltage than the rest of the nanocrystals under the control gate. During a read operation of an erased memory cell, a conductive channel is formed under the control gate and the select gate. However, the nanocrystals having the higher threshold voltage are prevented from becoming fully conductive, limiting formation of the channel. The reduced channel width will have a lower transconductance than a fully formed channel.

Figure 4:
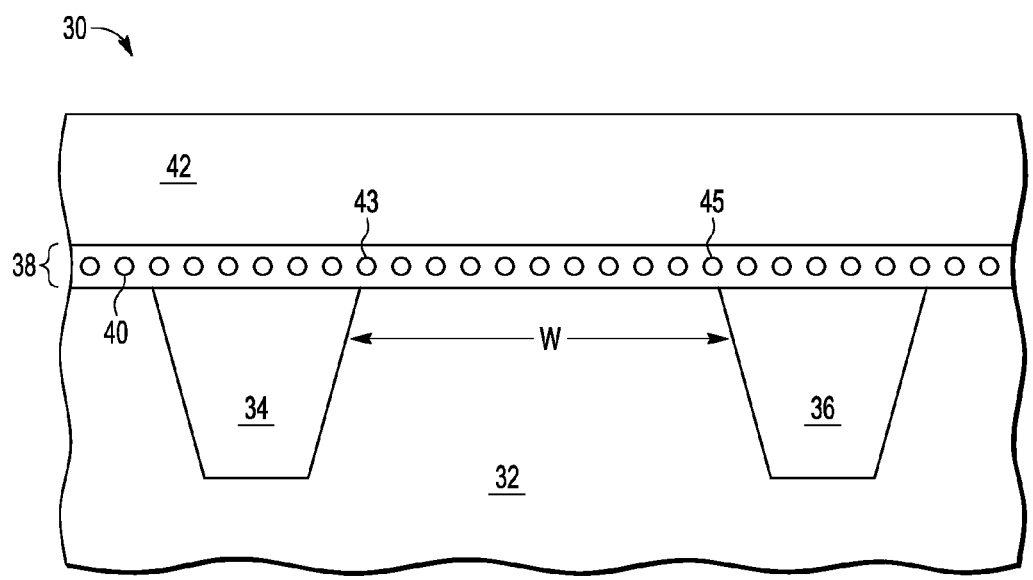
FIG. 4 illustrates a cross-sectional view of the memory cell of FIG. 2 along the line 4-4.

FIG. 4 illustrates a cross-sectional view of NVM cell 30 of FIG. 2 along the line 4-4. The nanocrystals causing the problem with channel formation are illustrated in FIG. 4. In FIG. 4 the edge nanocrystals 43 and 45 are illustrated at the edge of the active area, or trench isolation areas 34 and 36. The width W is labeled in FIG. 4 to be the full width of the region between trench isolation 34 and 36. However, during a read operation when the edge nanocrystals are not completely erased because of their placement at the edge, a channel cannot be formed fully between trench isolation 34 and 36 and the effective channel width will be less than width W. Because the channel is not fully formed, a transconductance of the channel will be lower causing the erased threshold voltage to be higher. A read margin of the cell will be degraded causing reduced reliability. The onset of the problem is gradual and depends on the number of program/erase cycles.

To provide for improved transconductance when the read threshold voltage is reduced because of edge nanocrystals 43 and 45, the distance between trench isolation 34 and 36 is increased, so that the channel width, or gate width is increased. This will improve transconductance, thus allowing for better erasure and lower erased threshold voltages.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
a first non-volatile memory array comprising a plurality of first non-volatile memory cells; and
a second non-volatile memory array comprising a plurality of second non-volatile memory cells, each of the plurality of second non-volatile memory cells having substantially the same features as the plurality of first non-volatile memory cells,
wherein dimensions of the features of the first and second non-volatile memory cells are substantially the same except that a channel width of each second non-volatile memory cell in the second non-volatile memory array is larger than a channel width of each first non-volatile memory cell in the first non-volatile memory array.

2. The integrated circuit of claim 1, wherein a first non-volatile memory cell of the plurality of first non-volatile memory cells and a second non-volatile memory cell of the plurality of second non-volatile memory cells are each characterized as a split-gate non-volatile memory cell having a control gate, a select gate, and a charge storage layer.

3. The integrated circuit of claim 1, wherein the channel width of a second non-volatile memory cell is at least 25% larger than the channel width of a first non-volatile memory cell.

4. The integrated circuit of claim 1, wherein the first non-volatile memory array is used to store processor instructions and the second non-volatile memory array is used to store data.

5. The integrated circuit of claim 2, wherein the charge storage layer includes one or more nanocrystals for storing charge.

6. The integrated circuit of claim 5, wherein the one or more nanocrystals are comprised of a semiconductor or metal material.

7. The integrated circuit of claim 1, further comprising a processor coupled to the first non-volatile memory array and second non-volatile memory array, the processor capable of providing control information to the first non-volatile memory array and second non-volatile memory array.

8. The integrated circuit of claim 1, wherein the channel width of a second non-volatile memory cell produces a higher transconductance than the channel width of a first non-volatile memory cell.

9. The integrated circuit of claim 1, wherein a second non-volatile memory cell is characterized as being capable of enduring a higher number of program/erase cycles than a first non-volatile memory cell.

10. A non-volatile memory comprising:
a code memory array comprising a plurality of first non-volatile memory cells, the first non-volatile memory cells each having a control gate, a select gate, a charge storage layer, and a first channel width; and a data memory array comprising a plurality of second non-volatile memory cells the second non-volatile memory cells each having a control gate, a select gate, a charge storage layer, and a second channel width, wherein the geometric dimensions of the first non-volatile memory cell and the second non-volatile memory cell are substantially the same except for the second channel width of the second non-volatile memory cells in the data memory array having a larger width than the first channel width of the first non-volatile memory cells in the code memory array.

11. The non-volatile memory of claim 10, wherein the control gate, the select gate, and the charge storage layer of first non-volatile memory cell and the second non-volatile memory cell are each configured as a split-gate non-volatile memory cell.

12. The non-volatile memory of claim 10, wherein the charge storage layer of the first non-volatile memory cell and the second non-volatile memory cell includes one or more nanocrystals for storing charge, the one or more nanocrystals comprising a semiconductor or metal material.

13. The non-volatile memory of claim 10, wherein the first channel width is proportional to a first channel transconductance of the first non-volatile memory cells in the code memory array and the second channel width is proportional to a second channel transconductance of the second non-volatile memory cells in the data memory array, the second channel transconductance of the second non-volatile memory cells being larger than the first channel transconductance of the first non-volatile memory cells.

14. The non-volatile memory of claim 13, wherein the second channel transconductance of the second non-volatile memory cells in the data memory array is at least 25% larger than the first channel transconductance of the first non-volatile memory cells in the code memory array.

15. An integrated circuit comprising:

a processor;

a code memory array for storing processor instructions, the code memory array comprising a plurality of first non-volatile memory cells, each of the first non-volatile memory cells having a first channel transconductance; and a data memory array for storing data used by the integrated circuit, the data memory array comprising a plurality of second non-volatile memory cells, each of the second non-volatile memory cells having a second channel transconductance, the second channel transconductance of being larger than the first channel transconductance, wherein the processor is coupled to the code memory array and the data memory array via a bus.

16. The integrated circuit of claim 15, wherein the processor is capable of providing program or erase control information to the code memory array and to the data memory array.

17. The integrated circuit of claim 15, wherein the processor is capable of executing instructions stored in the code memory array.

18. The integrated circuit of claim 15, wherein the code memory array and the data memory array can share program and erase voltage supply sources.

19. The integrated circuit of claim 15, wherein the code memory array and the data memory array can be accessed independently via the bus.

20. The integrated circuit of claim 15, wherein the first non-volatile memory cell and the second non-volatile memory cell are each configured as a split-gate non-volatile memory cell further comprising a nanocrystal charge storage layer.

* * * * *